United States Patent
Sumiya et al.

(10) Patent No.: US 7,820,246 B2
(45) Date of Patent: Oct. 26, 2010

(54) METHOD FOR GROWING THIN NITRIDE FILM ONTO SUBSTRATE AND THIN NITRIDE FILM DEVICE

(75) Inventors: Masatomo Sumiya, Hamamatsu (JP); Shunro Fuke, Hamamatsu (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 775 days.

(21) Appl. No.: 10/562,265

(22) PCT Filed: Jun. 15, 2004

(86) PCT No.: PCT/JP2004/008351

§ 371 (c)(1),
(2), (4) Date: May 24, 2006

(87) PCT Pub. No.: WO2005/004213

PCT Pub. Date: Jan. 13, 2005

(65) Prior Publication Data

US 2007/0042560 A1 Feb. 22, 2007

(30) Foreign Application Priority Data

Jul. 1, 2003 (JP) ............................... 2003-189457

(51) Int. Cl.
*H01L 21/76* (2006.01)

(52) U.S. Cl. ........................... 427/299; 117/30; 117/54; 117/79; 117/85; 117/103

(58) Field of Classification Search ................. 427/299; 117/30–35, 54, 79, 85–92, 103–108
See application file for complete search history.

(56) References Cited

U.S. PATENT DOCUMENTS

| | | | | |
|---|---|---|---|---|
| 6,335,546 | B1 * | 1/2002 | Tsuda et al. | 257/94 |
| 6,607,595 | B1 * | 8/2003 | Manabe et al. | 117/88 |
| 6,723,165 | B2 * | 4/2004 | Ogawa et al. | 117/95 |
| 2002/0048964 | A1 * | 4/2002 | Yuasa et al. | 438/763 |
| 2003/0145783 | A1 * | 8/2003 | Motoki et al. | 117/89 |

FOREIGN PATENT DOCUMENTS

| | | |
|---|---|---|
| JP | 3-17272 | 1/1991 |
| JP | 6-326416 | 11/1994 |
| JP | 8-167596 | 6/1996 |
| JP | 2001-185487 | 7/2001 |
| JP | 2002-16056 | 1/2002 |
| JP | 2002-25998 | 1/2002 |
| JP | 2002-270525 | 9/2002 |
| JP | 2003-142406 | 5/2003 |
| JP | 2004-022563 | 1/2004 |

* cited by examiner

*Primary Examiner*—Timothy H Meeks
*Assistant Examiner*—Nathan T Leong
(74) *Attorney, Agent, or Firm*—Oblon, Spivak, McClelland, Maier & Neustadt, L.L.P.

(57) ABSTRACT

The present invention provides a method for growing a thin nitride film over a substrate and a thin nitride film device, in which the polarity of the thin nitride film can be controlled by a low temperature process. In the method for growing the thin nitride film over a substrate, a Ga face (2) and a N face (3) are formed over a c face sapphire ($Al_2O_3$) substrate (1), the Ga face (2) growing in +c face, and the N face (3) growing in −c face.

5 Claims, 5 Drawing Sheets (a)

(b)

METHOD FOR GROWING THIN NITRIDE FILM ONTO SUBSTRATE AND THIN NITRIDE FILM DEVICE

TECHNICAL FIELD

The present invention relates to a method for controlling an internal electric field of a thin nitride film and to a resulting thin nitride film device.

BACKGROUND ART

When thin nitride films are grown on substrates, the internal electric fields of the thin nitride films have been controlled mainly by conventional high-temperature methods at temperatures of 1000 degrees or higher.

DISCLOSURE OF INVENTION

These conventional methods, however, cannot significantly control the polarity of the thin nitride film in accordance with an arbitral mask pattern, because the high temperatures of 1000 degrees or higher cancel out the effects of previous treatments on the substrate surface.

Under these circumstances, an object of the present invention is to provide a method for growing a thin nitride film over a substrate; and a thin nitride film device, in which the polarity of the thin nitride film can be controlled by a low temperature process.

To achieve the above object:

(1) A method for growing a thin nitride film over a substrate is characterized by carrying out a low temperature process using a solution to thereby control the polarity of the thin nitride film.

(2) In the method for growing a thin nitride film over a substrate according to (1), the substrate can be a sapphire substrate, and the low temperature process can include subjecting the sapphire substrate to $H_2$ cleaning and treating the cleaned sapphire substrate with an acidic solution.

(3) In the method for growing a thin nitride film over a substrate according to (2), the acidic solution can be nitric acid.

(4) The method for growing a thin nitride film over a substrate according to (1) can include the steps of subjecting the substrate to $H_2$ cleaning, forming a mask, and treating the cleaned substrate with a solution through the mask to thereby form patterned regions having different polarities in the thin nitride film.

(5) A thin nitride film device is formed by the method for growing a thin nitride film over a substrate according to (1).

(6) The thin nitride film device according to (5) can include a c face sapphire ($Al_2O_3$) substrate, a Ga face and a N face arranged over the c face sapphire ($Al_2O_3$) substrate, the Ga face growing in +c face, and the N face growing in −c face.

(7) The thin nitride film device according to (5) can be a device including a separated element and/or a device having a periodically patterned surface.

BEST MODE FOR CARRYING OUT THE INVENTION

Some embodiments of the present invention will be illustrated in detail below.

Figure 1:
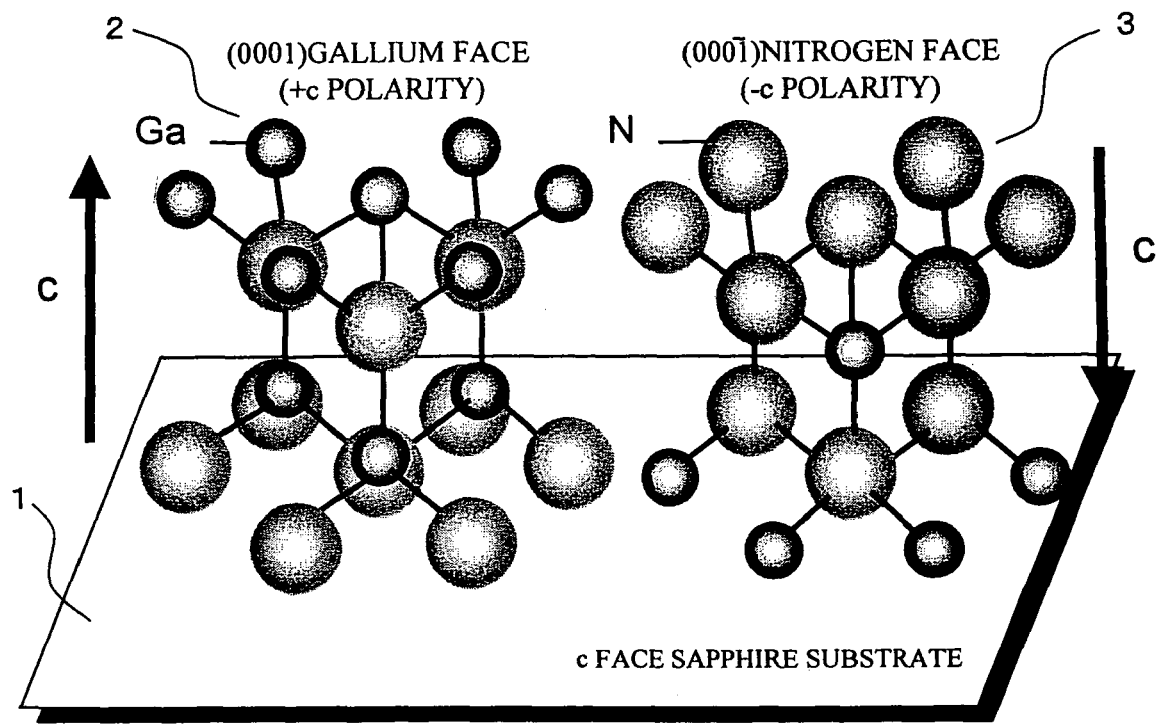
FIG. 1 is a schematic diagram of a GaN polarity structure as an embodiment of the present invention.
Figure 2:
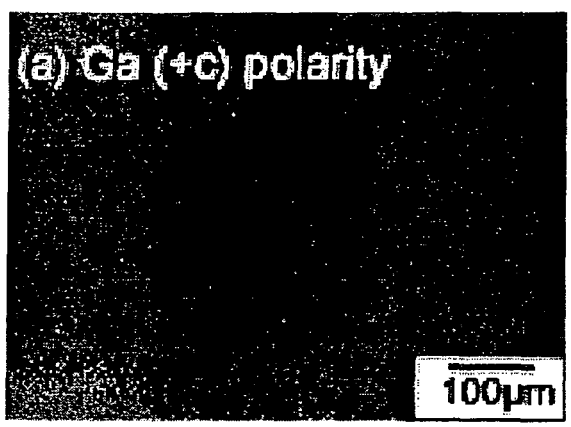
FIG. 2 shows plan views (observed planes) of polarities of individual regions of the GaN polarity structure as the embodiment of the present invention.
Figure 2:
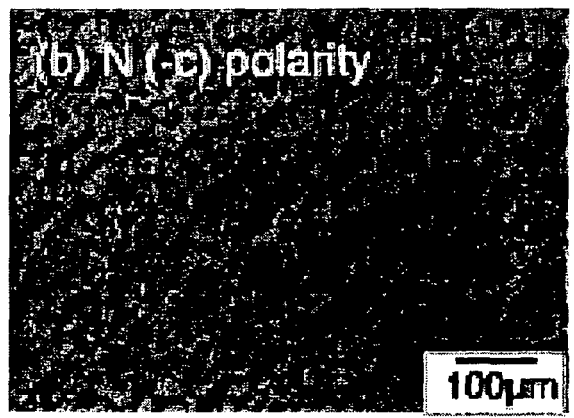

FIGS. 1 and 2 are a schematic view and plan views (observed planes) showing the polarities of individual regions, respectively, of a GaN polarity structure as an embodiment of the present invention.

FIG. 1 illustrates a c face sapphire ($Al_2O_3$) substrate 1, a Ga face 2 growing in +c face on the sapphire substrate 1, and a N face 3 growing in −c face on the sapphire substrate 1. The Ga face 2 is obtained by carrying out $H_2$ cleaning of the sapphire substrate 1. The N face 3 is obtained by carrying out $H_2$ cleaning and nitriding of the sapphire substrate 1. The N face 3 can be etched with an alkaline solution.

Thus, a bipolar thin GaN film can be grown on one sapphire substrate.

Such a bipolar thin GaN film can be grown in the following manner. A sapphire ($Al_2O_3$) (0001) substrate is subjected to $H_2$ cleaning, and an arbitral mask is formed over the substrate using a photoresist, for partially treating the substrate with nitric acid. The resulting substrate is then immersed in a nitric acid solution.

According to the present invention, the treatment of the sapphire substrate with nitric acid solution after the $H_2$ cleaning is carried out under the conditions at a nitric acid ($HNO_3$) concentration of 6-63% and a temperature of 40° C. for 0 to 10 minutes (min). In contrast, the conventional high-temperature nitriding (comparative example) is carried out under the conditions at a temperature of 750° C. to 1100° C. and a partial pressure of $NH_3$ of 50% for 5 minutes (min).

Figure 3:
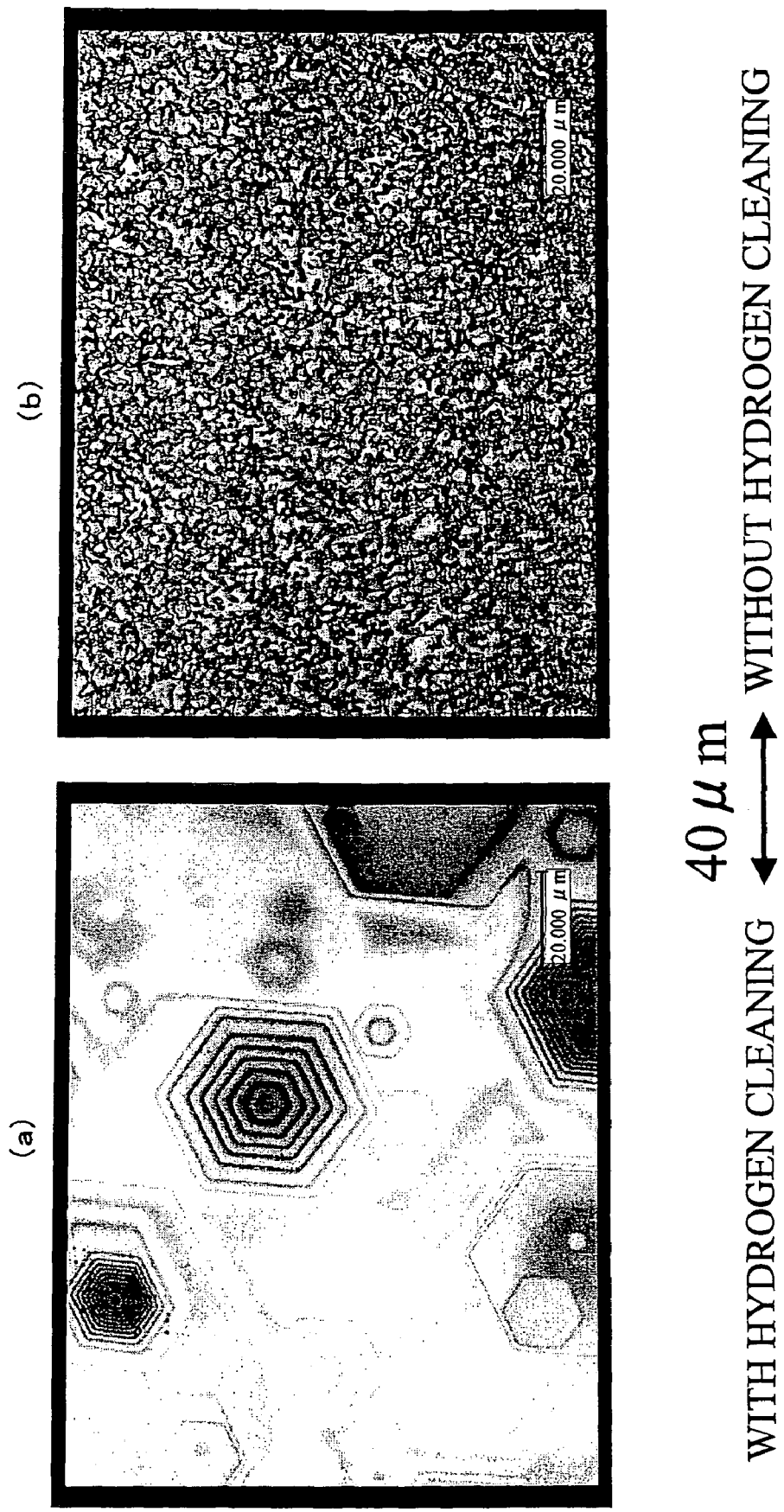
FIG. 3 shows diagrams as comparison in N face growth as a result of treatment with nitric acid between with or without $H_2$ cleaning of a sapphire substrate.

FIG. 3 shows diagrams as comparison in N face growth as a result of treatment with nitric acid between with or without $H_2$ cleaning of a sapphire substrate, in which FIG. 3(a) is a diagram showing the case where the $H_2$ cleaning has been carried out (according to the present invention), and FIG. 3(b) is a diagram showing the case where the $H_2$ cleaning has not been carried out (comparative example).

Evaluation methods are as follows. X-ray photoelectron spectroscopy (XPS), atomic force microscopy (AFM), and reflectance high energy electron diffraction (RHEED) are used for observing boundaries (interfaces) and surfaces of the substrate. The change in a buffer layer as a result of the heat treatment is observed based on the intensity in X-ray diffractometry (XRD) and/or atomic force microscopy (AFM). A grown layer can be observed by X-ray diffractometry (XRD) intensity and/or the full width at half maximum in XRC.

FIG. 3(a) shows that many hexagonal facets specific to the N face polarity are observed on the surface of the thin nitride film when $H_2$ cleaning has been performed. FIG. 3(b) demonstrates that the thin film does not grow sufficiently and has a very rough surface when $H_2$ cleaning has not been performed.

Figure 4:
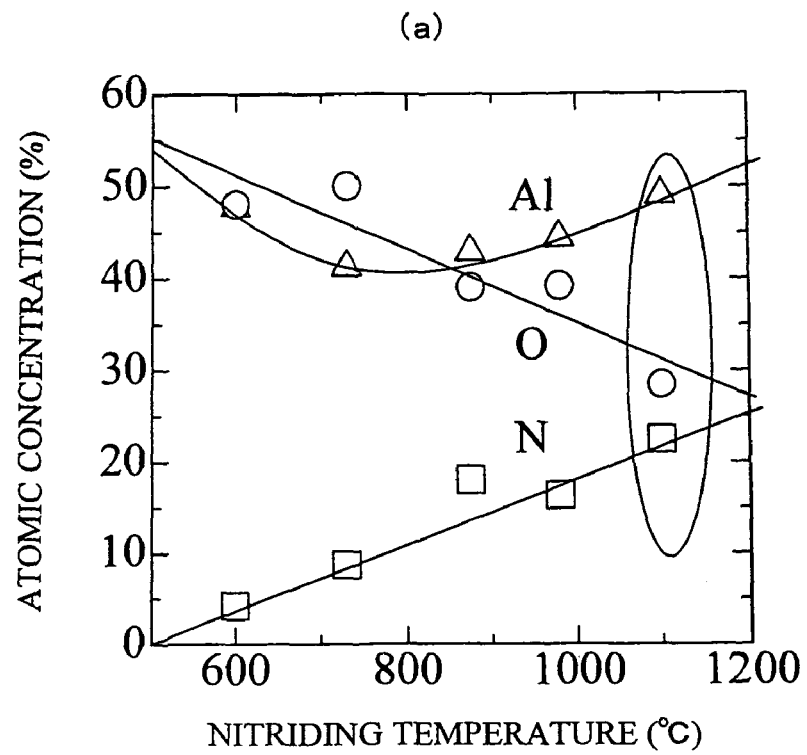
FIG. 4 shows diagrams as comparison in element ratio of surface after nitric acid treatment.
Figure 4:
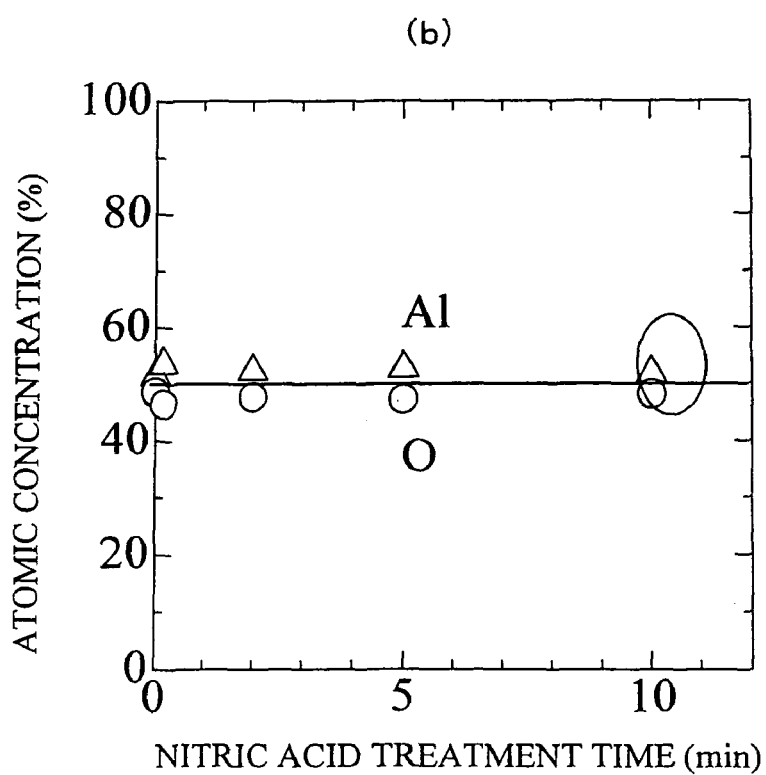

FIG. 4 shows diagrams as comparison in element ratio of surfaces after nitric acid treatment. FIG. 4(a) shows the element ratio of the surface of the substrate plotted against the temperature in conventional high-temperature nitriding, with the abscissa indicating the nitriding temperature (° C.) and the ordinate indicating the atomic concentration (%). FIG. 4(b) shows the element ratio of the surface of the substrate plotted against the time in nitric acid treatment according to the present invention, with the abscissa indicating the nitric acid treatment time (min) and the ordinate indicating the atomic concentration (%). In. the figures, the open circle, open triangle and open square represent data of oxygen, aluminum (Al), and nitrogen (N), respectively.

In the high-temperature nitriding shown in FIG. 4(a), the oxygen concentration decreases and, instead, the nitrogen concentration increases with an increasing nitriding temperature. This indicates that nitrogen atoms are adsorbed by the surface of the sapphire substrate as a result of the high-temperature nitriding to thereby change the element ratio of the substrate surface.

In contrast, in the nitric acid treatment shown in FIG. 4(b), no adsorption of nitrogen atoms is observed even when the treatment time is long, indicating that the element ratio of the surface of the sapphire substrate after $H_2$ cleaning is maintained.

Figure 5:
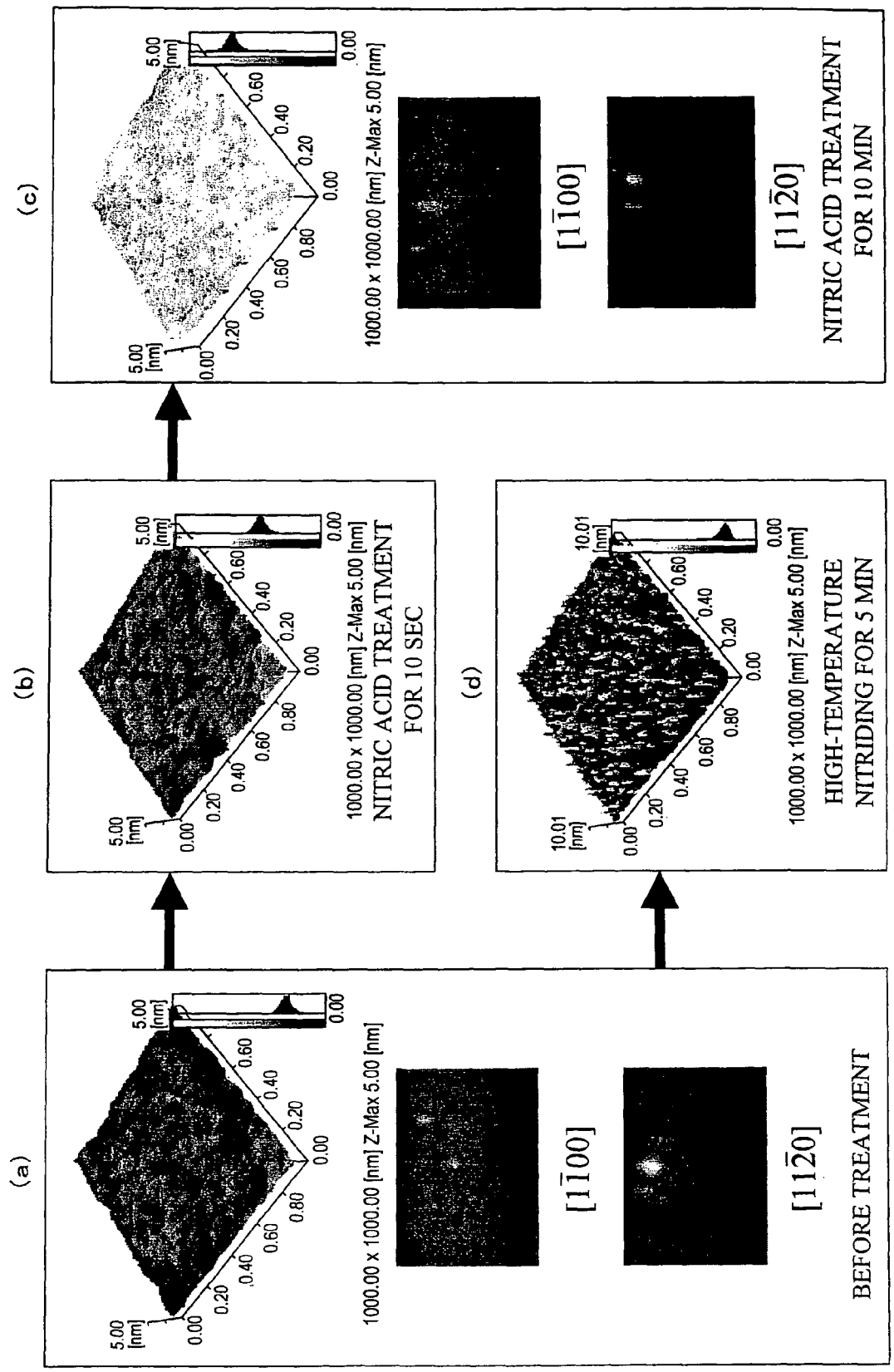
FIG. 5 shows diagrams as comparison in surface of substrate.

FIG. 5 shows diagrams as comparison on surfaces of substrates. FIGS. 5(a), 5(b), 5(c), and 5(d) show the surfaces of the substrates before treatment, after nitric acid treatment according to the present invention for 10 seconds, after nitric acid treatment for 10 minutes, and after conventional high-temperature nitriding for 5 minutes, respectively.

White images in the figures are RHEED patterns when electron beams enter from the [1-100] and [11-20] directions of the substrate. An RHEED pattern indicating the formation of AlN is observed after the conventional high-temperature nitriding (the pattern is reversed with respect to the same incident direction). In contrast, there is no change between the RHEED patterns in FIG. 5(a) and FIG. 5(c), indicating that the nitric acid treatment does not invite the formation of AlN on the surface of the sapphire substrate.

Figure 6:
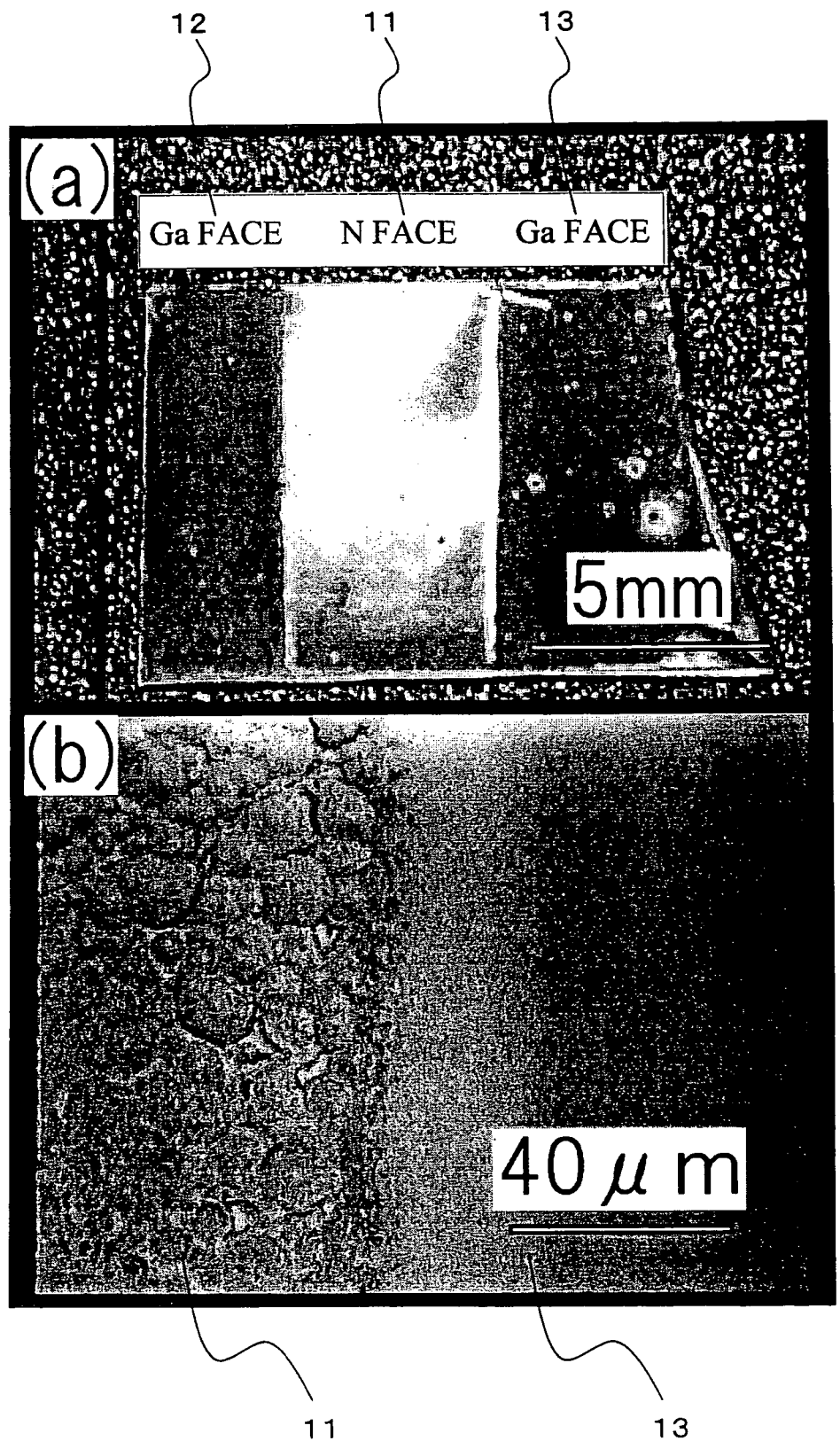
FIG. 6 shows diagrams illustrating the formation of bipolar GaN on a sapphire substrate partially treated with nitric acid using a mask formed from a photoresist, according to the present invention.

FIG. 6 shows diagrams illustrating the formation of bipolar GaN on a sapphire substrate partially treated with nitric acid using a mask formed from a photoresist, according to the present invention.

FIG. 6(a) shows that a Ga face region 12, a N face region 11, and a Ga face region 13 can be simultaneously grown on one substrate.

FIG. 6(b) is an enlarged view of the boundary between the N face region 11 and the Ga face region 13, indicating that the mask formed from the photoresist clearly defines the boundary region. This demonstrates that the N face region 11 and the Ga face region 13 can be grown to arbitrary sizes by the control of the shape of the mask.

The thin nitride film device obtained by the method for growing a thin nitride film over a substrate according to the present invention can have arbitrary controlled polarities and can constitute a device having a separated element and/or a substrate (device) having a periodically patterned surface.

It is to be understood that the present invention is not limited to the embodiments as mentioned above, and various modifications and variations can be made in accordance with the sprit of the invention and are included within the scope of the invention.

As has been described in detail, the present invention can provide a method for growing a thin nitride film over a substrate, and a thin nitride film device, in which the polarity of the thin nitride film can be controlled by a low temperature process.

INDUSTRIAL APPLICABILITY

The method for growing a thin nitride film over a substrate and the resulting thin nitride film device according to the present invention enable the control of the polarity of the thin nitride film by a low temperature process and can be applied to light-emitting devices and electronic devices.

The invention claimed is:

1. A method for growing a thin bipolar gallium nitride film on a sapphire substrate, said method comprising:
    subjecting the sapphire substrate having arranged on a surface thereof a Ga face and a N face to $H_2$ cleaning to grow the Ga face in a (+c) direction; and
    treating the sapphire substrate, which has been subjected to $H_2$ cleaning, with a nitric acid solution with a nitric acid solution to grow the N face in a to grow the N face in a (−c) direction, wherein said treating is carried out at a temperature of 40° C. for a period of 10 seconds to 10 minutes,
    to thereby produce the thin bipolar gallium nitride film having a Ga face (+c) and a N face (−c) grown on the sapphire substrate.

2. The method according to claim 1, wherein said method further comprises:
    exposing the sapphire substrate to air before growing the thin bipolar gallium nitride film on the sapphire substrate.

3. The method according to claim 1, wherein said method further comprises, after said subjecting and before said treating:
    forming a mask on the sapphire substrate, whereby patterned regions having different polarities are formed in the thin bipolar gallium nitride film.

4. The method according to claim 3, wherein the mask is formed from a photoresist.

5. The method according to claim 1, wherein the sapphire substrate is a c face sapphire ($Al_2O_3$) substrate.

* * * * *